(12) United States Patent
Strobel

(10) Patent No.: US 6,804,968 B2
(45) Date of Patent: Oct. 19, 2004

(54) CRYOSTAT CONFIGURATION WITH IMPROVED PROPERTIES

(75) Inventor: Marco Strobel, Karlsruhe (DE)

(73) Assignee: Bruker Biospin GmbH, Rheinstetten (DE)

( * ) Notice: Subject to any disclaimer, the term of this patent is extended or adjusted under 35 U.S.C. 154(b) by 129 days.

(21) Appl. No.: 10/440,224

(22) Filed: May 19, 2003

(65) Prior Publication Data
US 2003/0230089 A1 Dec. 18, 2003

(30) Foreign Application Priority Data
Jun. 14, 2002 (DE) .......................... 102 26 498

(51) Int. Cl.⁷ .............................. F25B 19/00; F25B 9/00
(52) U.S. Cl. ............................................. 62/51.1; 62/6
(58) Field of Search ............................ 62/6, 45.1, 47.1, 62/51.1

(56) References Cited

U.S. PATENT DOCUMENTS

| | | | | |
|---|---|---|---|---|
| 4,277,949 A | * | 7/1981 | Longsworth | 62/54 |
| 4,790,147 A | * | 12/1988 | Kuriyama et al. | 62/514 R |
| 5,339,650 A | * | 8/1994 | Hakamada et al. | 62/51.1 |
| 5,379,600 A | | 1/1995 | Moritsu | |
| 5,721,522 A | * | 2/1998 | Roth et al. | 335/216 |
| 5,782,095 A | | 7/1998 | Chen | |
| 6,263,677 B1 | | 7/2001 | Hafner | |
| 6,389,821 B2 | | 5/2002 | Strobel | |

FOREIGN PATENT DOCUMENTS

| | | |
|---|---|---|
| EP | 0 726 582 | 8/1996 |
| EP | 0 773 450 | 5/1997 |
| EP | 0 937 995 | 8/1999 |
| EP | 0 955 555 | 11/1999 |
| GB | 2 367 354 | 3/2002 |
| JP | 112 57 770 | 9/1999 |

* cited by examiner

Primary Examiner—Denise L. Esquivel
Assistant Examiner—Malik N. Drake
(74) Attorney, Agent, or Firm—Paul Vincent

(57) ABSTRACT

A cryostat configuration for keeping liquid helium, comprising an outer jacket (2) accommodating a helium container (5), a neck pipe (3) which is filled with gaseous helium during operation, and a refrigerator (1; 1b), wherein the outer jacket (2), the helium container (5) and the neck pipe (3) delimit an evacuated chamber (9) which surrounds the helium container (5); and wherein the refrigerator (1; 1b) has a cooling finger (4) which has a condensation body (15; 15b) in the region of the lower end of the neck pipe (3), is characterized in that the condensation body (15; 15b) is partially surrounded by a condensation chamber (16; 16b) which has a first lower opening (17) to permit draining of liquid helium, and a second opening which communicates with a lower end of a gas supply pipe (18), wherein the upper end of the gas supply pipe (18) terminates in the region of the upper end of the neck pipe (3). This improves the thermal properties of the cryostat configuration. In particular, the convection flow inside the neck pipe (3) is controlled.

15 Claims, 4 Drawing Sheets

CRYOSTAT CONFIGURATION WITH IMPROVED PROPERTIES

This application claims Paris Convention priority of DE 102 26 498.8 filed Jun. 14, 2002 the complete disclosure of which is hereby incorporated by reference.

BACKGROUND OF THE INVENTION

The invention concerns a cryostat configuration for storing liquid helium, comprising an outer jacket accommodating a helium container, a neck pipe which is filled with gaseous helium during operation, and a refrigerator, wherein the upper end of the neck pipe is connected to the outer jacket which is at ambient temperature during operation, and the lower end of the neck pipe is connected to the helium container having liquid helium during operation, wherein the outer jacket, the helium container and the neck pipe delimit an evacuated chamber which surrounds the helium container, and wherein the refrigerator has a cooling finger which projects from the upper end of the neck pipe into the neck pipe and has a condensation body in the region of the lower end of the neck pipe which is cooled down to the temperature of liquid helium during operation.

A cryostat configuration of this type is disclosed e.g. in DE 100 33 410 C1.

Superconducting magnets are used to produce high magnetic field strengths, in particular in nuclear magnetic resonance apparatus. For operating superconducting magnets, the associated magnet coils, which are wound from a superconducting wire, must be cooled. To cool these magnet coils, they are typically disposed in liquid helium at a temperature of approximately 4.2 K. This cooling temperature is below the critical temperature (transition temperature) $T_c$ of the wire material and guarantees that the wire is in the superconducting state.

The cryostat configuration keeps the superconducting magnet at the predetermined operating temperature. The essential components of the cryostat configuration are a helium container which holds liquid helium and the superconducting magnet, an outer jacket, one or more neck pipes which connect the helium container to the outer jacket and which provide access to the inside of the helium container, and radiation shields which are disposed in an evacuated chamber between the helium container and the outer jacket.

The neck pipe or neck pipes are needed to charge the superconducting magnet and to fill the helium container with helium, and also permit evaporation of the helium. In particular, during a quench of a magnet coil in the helium container the magnet coil immediately heats to a temperature above the boiling temperature of liquid helium and large amounts of liquid helium are transferred into the gaseous phase. To prevent an inadmissibly high (i.e. explosive) pressure increase, the diameter of the neck pipe (or neck pipes) and of the connecting piece must be sufficiently large.

Neck pipes are usually made from stainless steel, titanium alloys or GFK. They typically have a length of approximately one meter or less and extend, perpendicular or slightly inclined, from their cold end connected to the helium container to their end connected to the outer jacket at ambient temperature.

The evacuated chamber and the radiation shields minimize heat entry into the helium container. Heat entry is effected in particular by radiation (originating in particular from the outer jacket at ambient temperature) through convection and thermal conduction from the residual gas in the evacuated chamber, through thermal conduction in the neck pipe and by convection and thermal conduction from the helium gas in the neck pipe.

Heat entry produces evaporation of the liquid helium. The lost helium must either be replenished—an expensive procedure in view of the amounts involved of approximately 0.1 l/h (liters per hour)—or refrigerators must be used for active cooling of the cryostat configuration. A cryostat configuration comprising a refrigerator for active cooling is known e.g. from EP 0 773 450 A1.

Such refrigerators consist substantially of a cold head, which is connected to a remote compressor via pressure lines and mounted via a mounting plate to the outer jacket, and of a cooling finger. The cooling finger projects into a neck pipe or into a separate opening in the evacuated chamber. During operation, the end of the cooling finger facing away from the mounting plate is cooled down to temperatures of between 2 and 3 K. Heat is either withdrawn from the helium by means of a condensation body (heat exchanger) or from the helium container via thermally conducting connections. The cooling finger typically consists of several parallel pipes, which have different functions for generating optimum cooling.

In principle, cold heads may also have several stages. A first stage, disposed closer to the mounting plate, is thereby cooled down during operation to a first low temperature while the further stages are cooled down to even lower temperatures. The different stages can be connected to the radiation shields and/or the helium container in a good thermally conducting fashion to actively cool these components.

Refrigerators for such applications can operate e.g. according to the Gifford-McMahon principle or be constructed as pulse tube coolers.

Installation of a cold finger in the neck pipe of the cryostat can cause convection in the neck pipe due to temperature gradients in the neck pipe wall or between the neck pipe wall and the cooling finger thereby producing additional, undesired heat entry into the helium container. These temperature gradients may be caused e.g. geometrically through the spatial configuration or through different thermal conductivities. These problems occur in particular if only little or no helium at all flows through the neck pipe.

In contrast thereto, it is the underlying purpose of the present invention to improve the thermal properties of a cryostat configuration with active refrigerator cooling and in particular control convection currents of gaseous helium inside a neck pipe.

SUMMARY OF THE INVENTION

This object is achieved in accordance with the invention in that the condensation body is at least partially directly surrounded by a condensation chamber which has a first lower opening which permits flow of liquid helium condensed in the condensation chamber into the helium container and which has a second opening which terminates in a lower end of a gas supply pipe, wherein the upper end of the gas supply pipe terminates inside the neck pipe in the region of the upper end thereof.

The inventive design of the cryostat configuration divides the condensation body into two regions: Helium gas is removed from the upper relatively warm region of the neck pipe via the gas supply pipe and condenses on the surface of the condensation body located within the condensation chamber. The condensed gas can drip or flow away through the first lower opening of the condensation chamber. The helium gas removed from the upper region of the neck pipe must be replaced from the underlying helium container, thereby producing a gas flow in the neck pipe. The condensation chamber does not surround a portion of the surface of the condensation body. Relatively cool helium from the direct vicinity, i.e. from the helium container, condenses on this other portion.

In this fashion, part of the energy provided for cooling the cold finger is utilized for generating a controlled helium gas flow in the neck pipe. Selection of the fraction of surface surrounded by the condensation chamber and the fraction of exposed surface of the condensation body can be used to adjust the intensity of the helium gas flow. This eliminates other undesired convection currents. In particular, the invention permits adjustment of the intensity of the convection current to the required or desired pre-cooling of the neck pipe wall (through rising, relatively cold gaseous helium).

The larger the portion of the surface of the condensation body surrounded by the condensation chamber, the larger the relative amount of condensed, originally relatively warm, helium gas from the upper region of the neck pipe and the stronger the helium gas flow in the neck pipe. The flow is also influenced by the position of the upper end of the gas supply pipe and the inner diameter of the gas supply pipe.

When the gas flow is sufficiently slow, a thermal balance of the helium gas flow is achieved, since the rising helium can exchange thermal energy with the helium descending in the gas supply pipe until a balanced state is obtained.

Conventional circulation cryostats usually have a degree of convection in the neck pipe, which is much larger than would be required for cooling the neck pipe wall. Interaction between the flowing gas and the warm upper end of the neck pipe or the mounting plate produces permanent, unnecessary heat entry into the helium container. This undesired heat entry must be compensated for in prior art through additional cooling, i.e. energy. The inventive cryostat configuration therefore reduces the operating costs of a cryostat configuration or of an NMR apparatus.

To prevent excessive gas flow into the condensation chamber through the first lower opening, the invention provides that the diameter of the first lower opening of the condensation chamber is considerably smaller than the diameter of the second opening and of the gas supply pipe. Alternatively, a valve is provided at the first lower opening, which only permits helium gas and/or liquid helium to flow out of the condensation chamber. Another possibility is that the flow of gaseous helium is blocked by the liquid helium in the helium tank (see below).

In a preferred embodiment of the inventive cryostat configuration, the evacuated chamber has a radiation shield which is coupled to the neck pipe in a thermally conducting fashion. The radiation shield reduces thermal irradiation into the helium container. The convection adjusted to the inventive cryostat configuration pre-cools the radiation shield thereby further improving its insulating properties.

In a further development of the above embodiment, the neck pipe has a connecting element of good thermal conductivity, which is disposed between the coupling to the radiation shield and a stage of the refrigerator. This effects direct cooling of the radiation shield via the additional stage of the refrigerator to improve the insulating properties of the inventive cryostat configuration.

In an inventive configuration of this further development, the connecting element contains copper or consists of copper. Copper has optimum material properties for this application, in particular good thermal conductivity even at the low temperatures during operation.

In an alternative or additional embodiment of the above further development of the inventive cryostat configuration, the connecting element divides the inside of the neck pipe into an upper and a lower part, the gas supply pipe penetrates the connecting element, and the connecting element has one or more gas passage openings in the outer region facing the evacuated chamber. This spatial configuration has particularly favorable convection properties. The relatively cold helium gas rises, in particular, in the region of the neck pipe wall. Clearly, in accordance with the invention, several radiation shields can also be connected to several stages of the refrigerator via several connecting elements.

In another embodiment, the refrigerator is a pulse tube cooler. Pulse tube coolers are low-maintenance and produce minimum vibrations.

One embodiment is particularly preferred with which the thermal conductivity of the condensation chamber is less than 300W/mK. This permits pre-selection of the degree of insulation of the condensation chamber via its wall material to adjust the fraction of pure condensation in the condensation chamber, i.e. the absolute amount of condensed helium per unit time, and the associated strength of the helium gas flow in the neck pipe.

In another particularly preferred embodiment of the inventive cryostat configuration, the gas supply pipe comprises a heat exchanger, which thermally couples the gas supply pipe to the helium located in the neck pipe during operation. This pre-cools the helium flowing into the condensation chamber thereby improving the efficiency of condensation. Heat entry into the helium container is also reduced.

One embodiment is particularly advantageous wherein the lower opening of the condensation chamber is completely immersed into liquid helium of the helium container during normal operation. In this configuration, gaseous helium cannot flow through the first lower opening into the condensation chamber. Such flow would impede the opposing discharge of condensed helium and also reduce the amount of the helium suctioned via the gas supply pipe. This embodiment also increases control of the helium gas flow (stabilized circulation).

In another inventive embodiment having the same advantages, a pipe-shaped extension is disposed on the lower opening of the condensation chamber whose end is completely immersed into liquid helium of the helium container during normal operation. This configuration is also more flexible through selection of the length of the pipe-shaped extension with regard to the position of the cooling finger and also with regard to the possible fill levels of the liquid helium in the helium container.

One embodiment of the inventive cryostat configuration is also preferred with which the refrigerator is set such that no helium is evaporated from the helium container during normal operation. This produces stable thermal conditions, i.e. there are few or no temperature fluctuations in the cryostat configuration, in particular in e.g. magnet coils in the helium container. Moreover, loss of expensive helium is prevented.

In one particularly preferred embodiment, the helium container has a superconducting magnet coil, which represents one important application of the cryostat configuration.

In a further development of this embodiment, the superconducting magnet coil is superconductingly short-circuited during normal operation. Due to the minimal loss ("low loss") in the circuit in the short-circuited superconducting magnet coil, an excellent temporal stability of the magnetic field generated by the magnet coil can be obtained. The stability of the inventive cooling device also increases the stability of the magnetic field.

Finally, one embodiment of the inventive cryostat configuration is preferred which is part of an NMR apparatus. Since refilling of liquid helium can be avoided and since a high temporal stability of the working conditions of the cryostat configuration can be obtained, the NMR apparatus can produce measuring results of particularly high resolution.

Further advantages of the invention can be extracted from the description and the drawing. The features mentioned above and below can be used in accordance with the invention either individually or collectively in arbitrary combination. The embodiments shown and described are not to be understood as exhaustive enumeration but have exemplary character for describing the invention.

The invention is shown in the drawing and is explained in more detail with reference to embodiments.

DESCRIPTION OF THE PREFERRED EMBODIMENT

Figure 1:
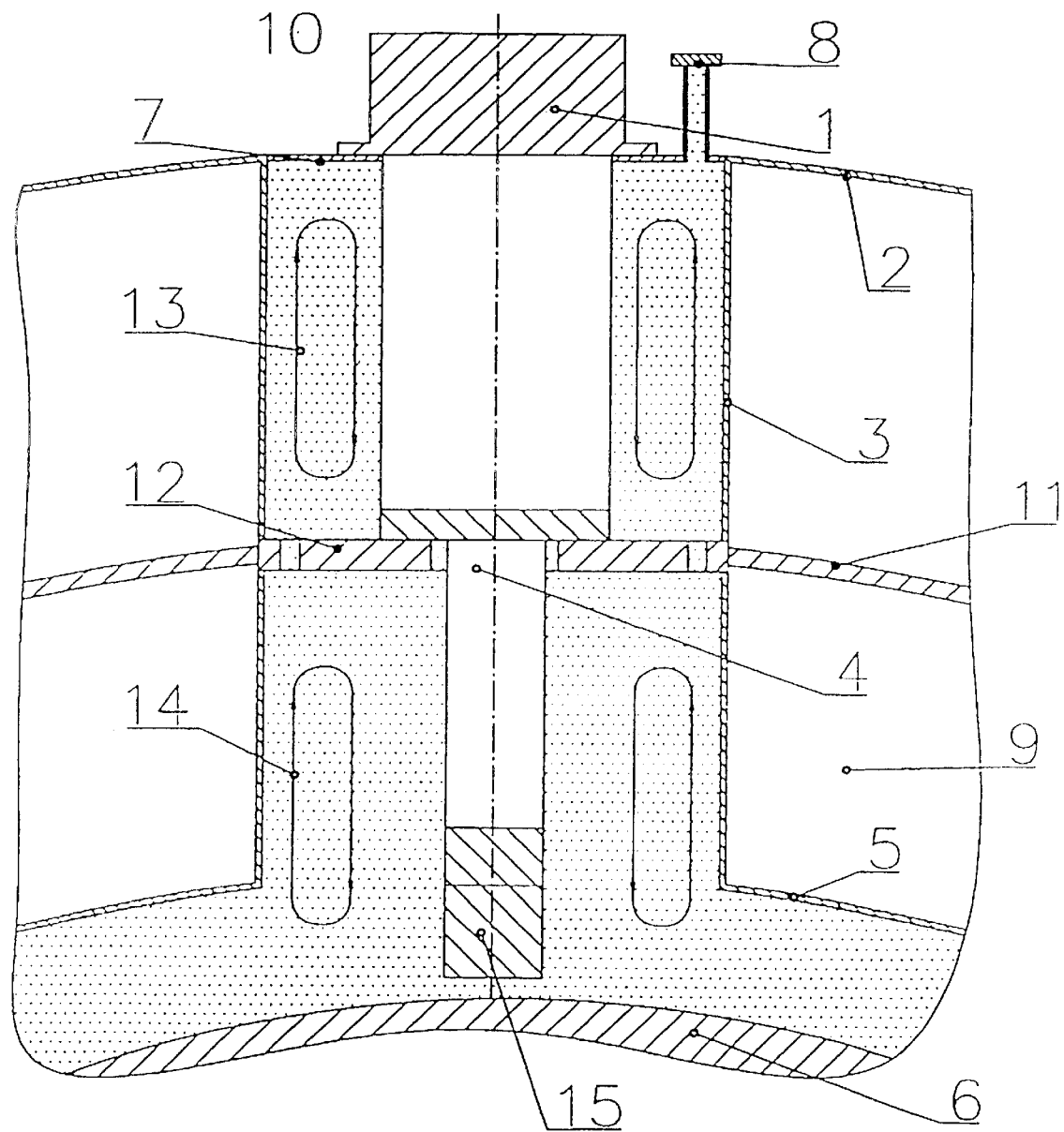
FIG. 1 shows a schematic cross-section of a cryostat configuration in the neck pipe region according to prior art.

FIG. 1 shows a schematic cross-section through a conventional cryostat configuration. A refrigerator 1 is connected to a compressor unit (not shown) via pressure lines (not shown) and, via a mounting plate 7, to the outer jacket 2 of the cryostat configuration. The mounting plate 7 simultaneously closes an upper end of a neck pipe 3, which extends approximately perpendicularly from the outer jacket 2 to the helium container 5. A connection piece 8 in the mounting plate 7 provides access via the neck pipe 3 from the exterior 10 of the cryostat configuration to the inside of the helium container 5 holding a magnet coil 6 of superconducting wire. This access is required for electrical connections e.g. for charging the magnet coil, or for filling the liquid helium. Liquid helium is located in the helium container 5 during normal operation and completely surrounds the magnet coil 6. The neck pipe 3 and the connection piece 8 permit discharge of helium gas into the exterior 10 which is immediately released in the event of abrupt failure of the superconductivity in the charged magnet coil (quench). This prevents a dangerous high-pressure increase in the helium container in the event of a quench.

The outer jacket 2, the neck pipe 3 and the helium container 5 delimit an evacuated chamber 9, which thermally insulates the helium container 5 and completely surrounds it. The evacuated chamber 9 prevents heat entry into the helium container 5 through convection or thermal conduction of gases. To improve the insulating properties, a radiation shield 11 is disposed in the evacuated chamber 9. The radiation shield 11 is coupled via a connecting element 12, having good thermal conducting properties, to an intermediate stage of the refrigerator to provide permanent active cooling of the radiation shield 11. Radiation heat introduced by the outer jacket 2 does not pass to the helium container 5 but to the refrigerator 1.

The refrigerator 1 has a two-stage cooling finger 4 which projects far into the neck pipe from above and extends into the helium container 5. The lower end of the cooling finger 4 has a condensation body 15 which is cooled down to a temperature below the boiling temperature of liquid helium (boiling point of helium approximately 4.2 K). Gaseous helium from the direct vicinity of the surface of the condensation body 15 is therefore condensed into liquid helium on the condensation body 15 and drips into the reservoir in the helium container 5.

The wall of the neck pipe 3 is in thermal contact with the outer jacket 2 and is therefore warmer than the average temperature of the helium gas in the neck pipe 3. The helium gas located in the direct vicinity of the neck pipe wall is warmed, thereby decreasing its density so that it rises. Due to active cooling, the wall of the refrigerator 1 or cooling finger 4 is colder than the average temperature of the helium gas in the neck pipe. For this reason, the helium gas in the direct vicinity of the refrigerator 1 is cooled thereby increasing its density so that it sinks due to gravity. This produces undesired convection flow 13 and 14 of helium gas in the neck pipe. The strength of this convection flow has turned out to be excessively large. Contact between the helium gas and comparatively warm components of the cryostat, in particular the mounting plate 7 and the upper end of the neck pipe wall, causes this convection to produce heat entry into the helium container 5. For fixed overall cooling performance, the strength of convection remains largely uncontrolled in the cryostat configuration shown in FIG. 1.

Figure 2:
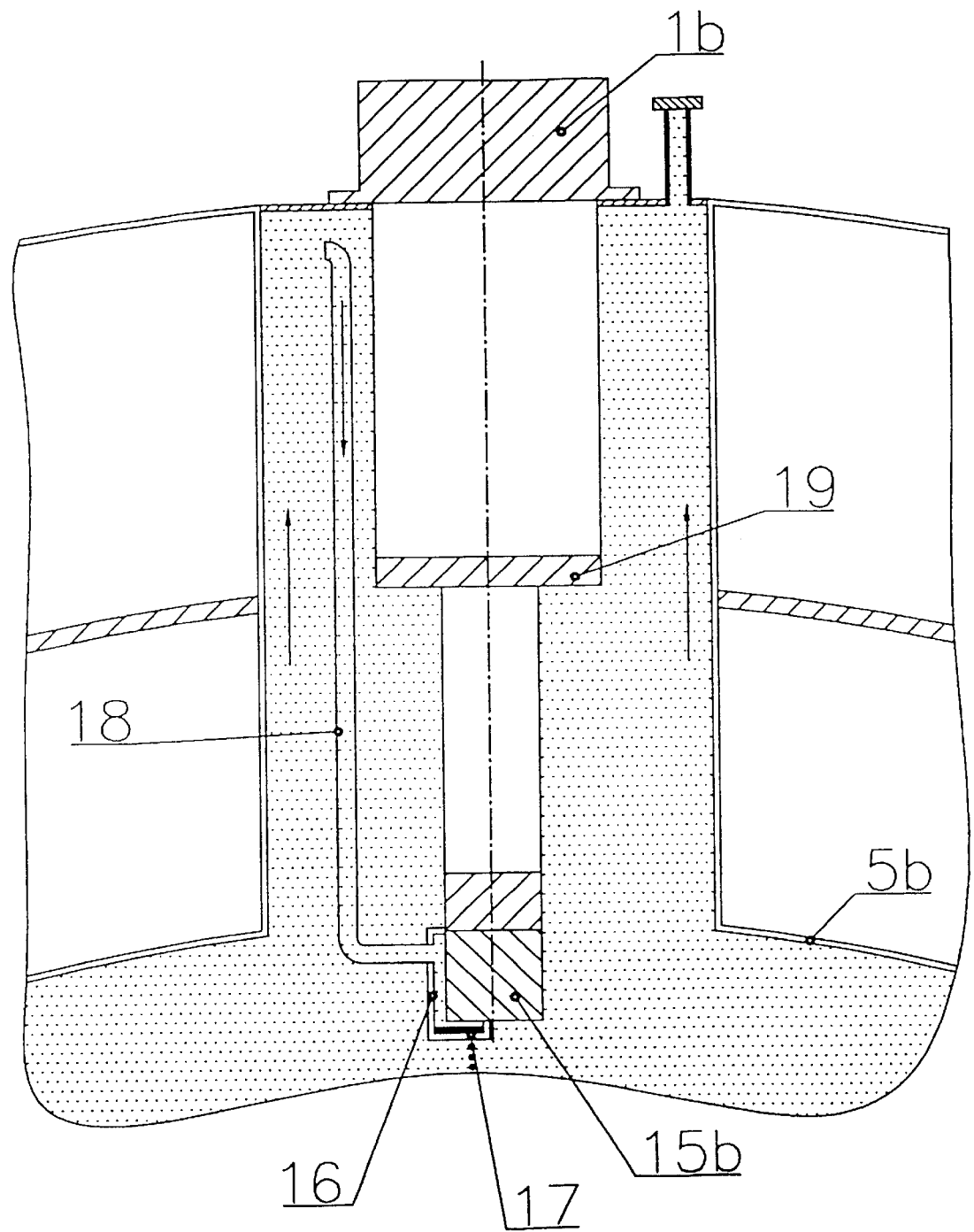
FIG. 2 shows a schematic cross-section through an embodiment of the inventive cryostat configuration in the neck pipe region.

FIG. 2 schematically shows an embodiment of an inventive cryostat configuration. It comprises substantial elements of the conventional cryostat configuration and also inventive extensions. A refrigerator 1b has an intermediate stage 19 (like the refrigerator 1 in FIG. 1), but has, in the region of a condensation body (i.e. heat exchanger ) 15b, a condensation chamber 16, which surrounds part of the condensation body 15b. This condensation chamber 16 has two openings: A first lower opening 17 permits discharge of condensed liquid helium from the condensation chamber 16 into a helium container 5b. A second opening (disposed on the side in the embodiment shown) opens into a gas supply pipe 18, which extends to the upper part of the inner region of the neck pipe and ends at that location.

Gaseous helium, which condenses in the condensation chamber 16, is replaced by gaseous helium flowing through the gas supply pipe. I.e. the condensation chamber suctions gaseous helium from the upper region of the neck pipe. In contrast thereto, gaseous helium must flow from the helium container 5b into the upper region of the neck pipe (see upward arrow).

This induces helium gas flow in the neck pipe corresponding to the directions of the arrows in FIG. 2. This stabilization cycle prevents, in particular, production of an undesired convection flow due to heating and cooling effects on the walls of neck pipe and/or refrigerator 1b and improves the thermal properties of the neck pipe region. The strength of the helium gas flow can be set by the fraction of condensation body surface, which is surrounded by the condensation chamber 16 and can be adjusted to the requirements of the cryostat configuration, in particular, to the spatial configuration of the components.

One advantage of this embodiment consists in the largely mechanical decoupling between refrigerator 1b and radiation shield through omission of the connecting element 12 as shown in FIG. 1. Possible vibrations of the refrigerator are thereby not transmitted to the radiation shield to increase the performance of magnetic resonance apparatus having a cryostat configuration of this kind.

Figure 3:
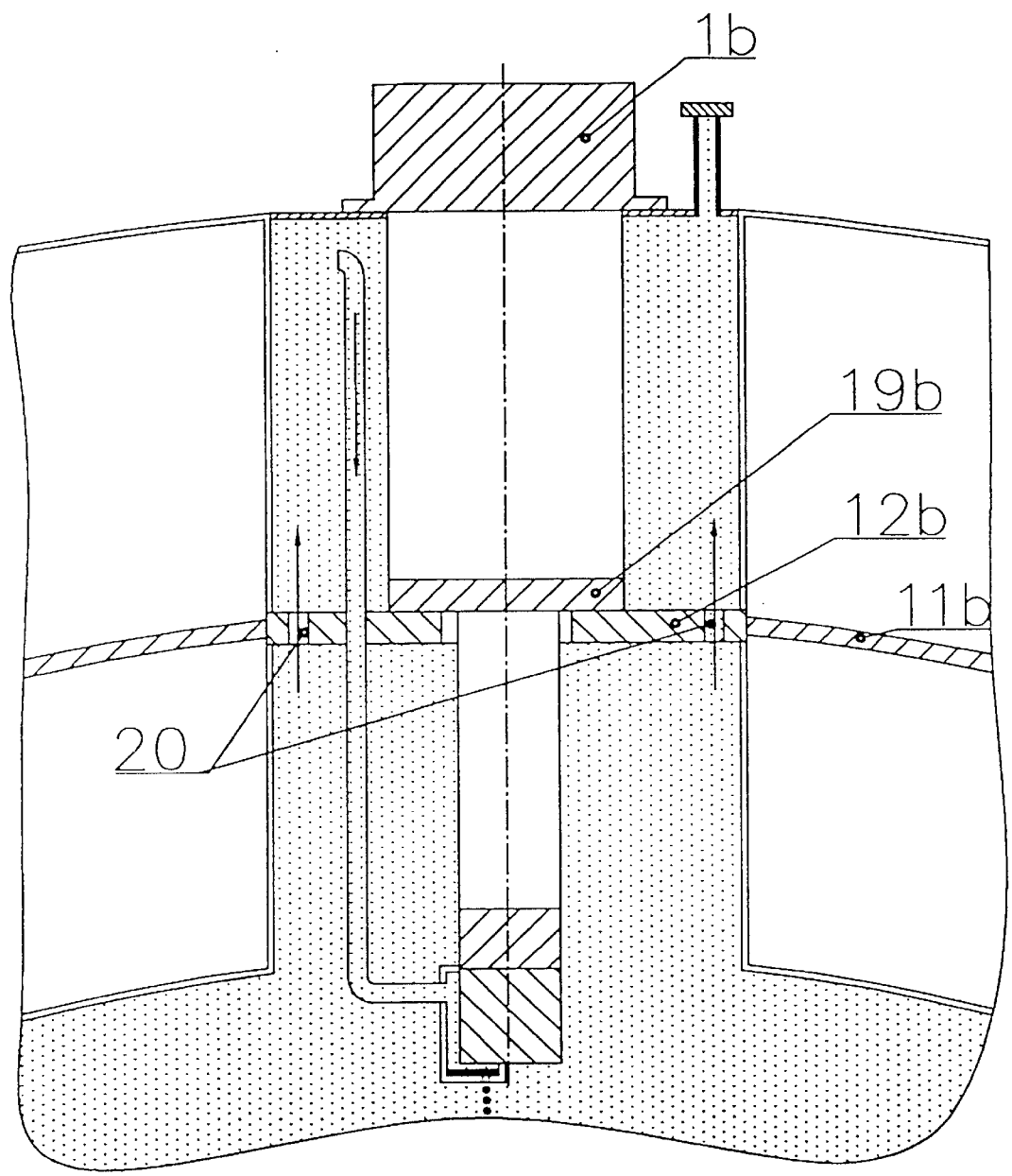
FIG. 3 shows a schematic cross-section through a further embodiment with a thermally conducting connecting element.

FIG. 3 shows a further embodiment of the inventive cryostat configuration. A radiation shield 11b is thermally coupled to an intermediate stage 19b of the refrigerator 1b via a connecting element 12b having good thermal conducting properties. The radiation shield 11b is thereby actively cooled to increase the temperature stability and insulation of the helium container. The connecting element 12b has gas passage openings 20 which permit formation of the desired helium circulation despite division of the neck pipe into an upper and lower region.

Figure 4:
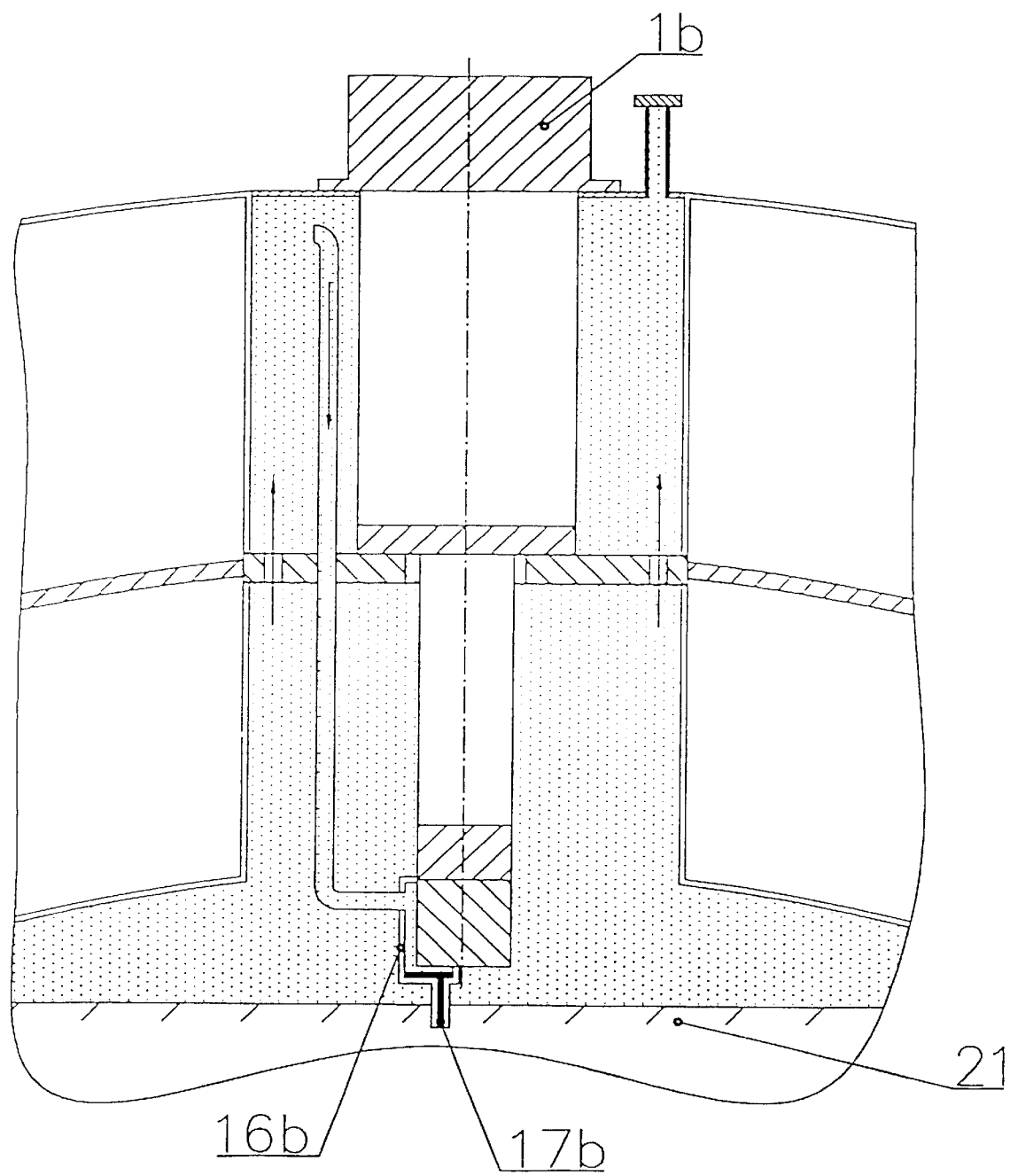
FIG. 4 shows a schematic cross-section through a third embodiment with a pipe-shaped extension on a condensation chamber.

Finally, FIG. 4 shows an embodiment of the inventive cryostat configuration whose condensation chamber 16b has a particular design. A first lower opening of the condensation chamber 16b has a pipe-shaped extension, which extends downwardly from the lower opening. The end 17b of the pipe-shaped extension is located below the surface of the reservoir of liquid helium 21 in the helium container. This prevents any flow of gaseous helium into the condensation chamber 16b via the first lower opening—even small amounts of gas are excluded. The volume contraction of helium during liquefaction, which occurs within the condensation chamber 16b is therefore completely available for suctioning gaseous helium from the upper region of the inside of the neck pipe. Under these conditions, surface division of the condensation body is a highly reliable method for separating the amounts of condensed helium gas from the upper neck pipe region and from the helium container.

In principle, the inventive cryostat configuration can not only be operated with helium but also with other gases or liquefied gases, in particular nitrogen. Nitrogen is much less expensive than helium. For cooling superconducting magnet coils, the transition temperature $t_c$ of the superconductor must be above the boiling point of the operating liquid.

A cryostat configuration for keeping liquid helium, comprising an outer jacket 2, a helium container 5 located therein, a neck pipe 3 filled with gaseous helium during operation and a refrigerator 1; 1b, wherein the outer jacket 2, the helium container 5 and the neck pipe 3 delimit an evacuated chamber 9 which surrounds the helium container 5, and wherein the refrigerator 1; 1b comprises a cooling finger 4 which has a condensation body 15; 15b in the region of the lower end of the neck pipe 3, is characterized in that the condensation body 15; 15b is partially surrounded by a condensation chamber 16; 16b which has a first lower opening 17 permitting discharge of liquid, and a second opening which terminates in a lower end of a gas supply pipe 18, wherein the upper end of the gas supply pipe 18 terminates in the region of the upper end of the neck pipe 3. This improves the thermal properties of the cryostat configuration. In particular, the convection currents inside the neck pipe are controlled.

List of Reference Numerals 1,1b refrigerator
2 outer jacket
3 neck pipe
4 cooling finger
5b helium container
6 magnet coil
7 mounting plate
8 connection piece
9 evacuated chamber
10 exterior
11,11b radiation shield
12b connecting element
13 convection flow
14 convection flow
15,15b condensation body
16,16b condensation chamber
17 lower opening
17b end of the pipe-shaped extension
18 gas supply pipe
19,19b intermediate stage
20 gas passage openings
21 liquid helium

I claim:

1. A cryostat configuration for keeping liquid helium, the cryostat configuration comprising:

an outer jacket at ambient temperature during operation of the cryostat configuration;

a helium container disposed within said outer jacket, said helium container containing helium during operation of the cryostat configuration;

a neck pipe filled with gaseous helium during operation of the cryostat configuration, wherein an upper end of said neck pipe is connected to said outer jacket and a lower end of said neck pipe is connected to said helium container, wherein said outer jacket, said helium container and said neck pipe delimit an evacuated chamber which surrounds said helium container;

a refrigerator having a cooling finger which extends from said upper end of said neck pipe into and through said neck pipe and has a condensation body disposed in a region of said lower end of said neck pipe, said condensation body cooled to a temperature of liquid helium during operation; and a thermal control device, said thermal control device having a condensation chamber which at least partially surrounds said condensation body, said condensation chamber having a lower opening to permit flow of liquid helium, condensed in said condensation chamber, into said helium container, said condensation chamber also having an upper opening, said thermal-control device further having a gas supply pipe having a lower opening communicating with said upper opening in said condensation chamber and an upper opening terminating in a region of said upper end of said neck pipe and inside said neck pipe.

2. The cryostat configuration of claim 1, further comprising a radiation shield disposed within said evacuated chamber, said radiation shield coupled to said neck pipe in a thermally conducting fashion.

3. The cryostat configuration of claim 2, further comprising a connecting element disposed in said neck pipe between said radiation shield and a stage of said refrigerator.

4. The cryostat configuration of claim 3, wherein said connecting element contains copper.

5. The cryostat configuration of claim 4, wherein said connecting element consists essentially of copper.

6. The cryostat configuration of claim 3, wherein said connecting element divides an inside of said neck pipe into an upper and lower part, wherein said gas supply pipe penetrates through said connecting element, wherein said connecting element has one or more gas passage openings in an outer region thereof facing said evacuated chamber.

7. The cryostat configuration of claim 1, wherein said refrigerator is a pulse tube cooler.

8. The cryostat configuration of claim 1, wherein said condensation chamber has a thermal conductivity of less than 300W/mK.

9. The cryostat configuration of claim 1, wherein said gas supply pipe comprises a heat exchanger which thermally couples said gas supply pipe to the gaseous helium located in said neck pipe.

10. The cryostat configuration of claim 1, wherein said lower opening in said condensation chamber is completely immersed in liquid helium of said helium container during normal operation.

11. The cryostat configuration of claim 1, further comprising a pipe-shaped extension disposed on said lower opening of said condensation chamber, said pipe shaped extension having a lower open end completely immersed in liquid helium of said helium container during normal operation.

12. The cryostat configuration of claim 1, wherein said refrigerator is structured and operated such that no helium evaporates from said helium container during normal operation.

13. The cryostat configuration of claim 1, wherein said helium container contains a superconducting magnet coil.

14. The cryostat configuration of claim 13, wherein said superconducting magnet coil is superconductingly short-circuited during normal operation.

15. The cryostat configuration of claim 1, wherein the cryostat configuration is part of an NMR apparatus.

* * * * *